(12) United States Patent
Hann

(10) Patent No.: US 9,584,137 B2
(45) Date of Patent: Feb. 28, 2017

(54) TRANSCEIVER UNIT

(75) Inventor: Kenneth Hann, Espoo (FI)

(73) Assignee: CORIANT OY, Espoo (FI)

( * ) Notice: Subject to any disclaimer, the term of this patent is extended or adjusted under 35 U.S.C. 154(b) by 980 days.

(21) Appl. No.: 13/300,728

(22) Filed: Nov. 21, 2011

(65) Prior Publication Data

US 2012/0128369 A1    May 24, 2012

(30) Foreign Application Priority Data

Nov. 24, 2010  (FI) ...................... 20106240

(51) Int. Cl.
*H04B 10/00* (2013.01)
*H03L 7/07* (2006.01)
*H04J 3/04* (2006.01)

(52) U.S. Cl.
CPC .............. *H03L 7/07* (2013.01); *H04J 3/047* (2013.01)

(58) Field of Classification Search
None
See application file for complete search history.

(56) References Cited

U.S. PATENT DOCUMENTS

| | | | |
|---|---|---|---|
| 6,490,067 B2* | 12/2002 | Bloom et al. | 398/128 |
| 7,535,953 B2 | 5/2009 | Nomura et al. | |
| 2005/0117855 A1* | 6/2005 | Yang et al. | 385/92 |
| 2006/0239690 A1* | 10/2006 | Dybsetter et al. | 398/135 |
| 2008/0101514 A1* | 5/2008 | Laulainen et al. | 375/354 |
| 2010/0040369 A1 | 2/2010 | Zhao et al. | |

FOREIGN PATENT DOCUMENTS

| | | |
|---|---|---|
| CN | 1638299 A | 7/2005 |
| CN | 101166082 A | 4/2008 |
| WO | 2010066664 | 6/2010 |

OTHER PUBLICATIONS

Kozierok, "The TCP/IP Guide: A Comprehensive, Illustrated Internet Protocols Reference", 2005, William Pollock, pp. 95-98.*
Finnish Search Report dated Sep. 19, 2011, corresponding to the Priority Application No. 20106240.
(Continued)

*Primary Examiner* — Ken N Vanderpuye
*Assistant Examiner* — David Lambert
(74) *Attorney, Agent, or Firm* — Young & Thompson

(57) ABSTRACT

A phase synchronized optical master-slave loop comprises at the slave-end a processor (105) configured to include a first timing signal into a bit stream to be transmitted to the master-end, detect a second timing signal from a bit stream received from the master-end, and calculate a phase difference between a regenerated phase signal and a reference phase signal on the basis of a transmission moment of the first timing signal, a first time-stamp indicating a reception moment of the first timing signal at the master-end, a reception moment of the second timing signal, and a second time-stamp indicating a transmission moment of the second timing signal from the master-end. The processor is configured to read the time stamps from the received bit stream that corresponds to a received light signal according to a reception line-code. Thus, conversion of data format is not necessary for the phase synchronization.

24 Claims, 5 Drawing Sheets

(56) References Cited

OTHER PUBLICATIONS

S. Lv et al.; "An Enhanced IEEE 1588 Time Synchronization for Asymmetric Communication Link in Packet Transport Network" IEEE Communications Letters, vol. 14, No. 8, Aug. 2010, pp. 764-766.
IEEE Standard for a Precision Clock Synchronization Protocol for Networked Measurement and Control Systems; IEE Std. 1588-2008; pp. 16-40.
EP Search Report dated Mar. 13, 2012 from EP11189273.
Chinese Search Report, dated Jun. 3, 2014, from corresponding CN application.

* cited by examiner

TRANSCEIVER UNIT

FIELD OF THE INVENTION

The invention relates to a transceiver unit for a slave-end of a phase synchronized loop and to a transceiver unit for a master-end of a phase synchronized loop. Furthermore, the invention relates to a method for operating as a slave-end of a phase synchronized loop and to a method for operating as a master-end of a phase synchronized loop. Furthermore, the invention relates to a computer program for a slave-end of a phase synchronized loop and to a computer program for a master-end of a phase synchronized loop.

BACKGROUND

Data transfer networks include network elements such as, for example, routers, switches, and terminal devices which communicate with each other via data transfer links between the network elements. In many data transfer networks, there is a need to distribute clock-time information among the network elements. The network elements can be arranged to constitute master-slave pairs so that each master-slave pair operates as a phase synchronized loop and the clock time information prevailing at the master-end of the phase synchronized loop is transferred to the slave-end of the phase synchronized loop. Timing protocols, e.g. a timing protocol according to the IEEE 1588 specification (Institute of Electrical and Electronics Engineers) can be implemented to transfer the clock-time information from the master-end to the slave-end.

Typically the timing protocols are implemented in a way that the actions related to a timing protocol under consideration are carried out in several interconnected units of a network element. For example, time stamping and other time critical actions are usually carried out in transceiver units of the network element whereas some other actions, such as computations, are usually carried out in the CPU (Central Processing Unit) of the network element. This means that the different interconnected units of the network element have to be compatible with each other so that these units form together a system capable of running the timing protocol being used. This requirement increases the complexity and many times also the price of the network element.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the first aspect of the invention there is provided a new transceiver unit for a slave-end of a phase synchronized loop. The transceiver unit according to the invention comprises:
  an optoelectronic transmitter for producing, according to a transmission line-code, a first light signal carrying a bit stream to be transmitted and for directing the first light signal into an optical data transfer link between the slave-end and a master-end of the phase synchronized loop,
  an optoelectronic receiver for receiving a second light signal from the optical data transfer link and for detecting, according to a reception line-code, a received bit stream from the second light signal,
  electrical connectors for receiving from an external device at least part of the information contained by the bit stream to be transmitted and for delivering to the external device at least part of the information contained by the received bit stream, and
  a processor for including a first timing signal into the bit stream to be transmitted, for detecting a second timing signal from the received bit stream, and for calculating a phase difference between a phase signal prevailing at the transceiver unit and a reference phase signal prevailing at the master-end on the basis of (i) a transmission moment of the first timing signal at the transceiver unit, (ii) a first time-stamp indicating a reception moment of the first timing signal at the master-end, (iii) a reception moment of the second timing signal at the transceiver unit, and (iv) a second time-stamp indicating a transmission moment of the second timing signal at the master-end,
  wherein the transmission line-code defines the manner the bit stream to be transmitted is encoded to the properties of the first light signal and the reception line-code defines the manner the received bit stream is encoded to the properties of the second light signal, and the processor is configured to read information indicating the values of the first and second time stamps from the received bit stream that is in a form corresponding to the second light signal according to the reception line-code.

As the processor, which is arranged to carry out the calculations, is also arranged to read the information indicating the values of the first and second time stamps from the received bit stream that is in the form corresponding to the second light signal according to the reception line-code, the transceiver unit can be such a transceiver unit in which there is no physical media interface circuit, i.e. a PHY-circuit, or other circuitry which converts the received bit stream from the line code form to a form suitable for other units of a network element. Thus, there is no need to perform the handling of the time stamps and the computing of the phase difference in different units of a network element.

It should be noted that the words "first" and "second" in conjunction with the first and second time stamps and the first and second timing signals do not indicate the temporal order of these time stamps and timing signals but the words "first" and "second" are used as labels only.

In accordance with the second aspect of the invention there is provided a new transceiver unit for a master-end of a phase synchronized loop, the transceiver unit comprising:
  an optoelectronic receiver for receiving a first light signal from an optical data transfer link and for detecting, according to a reception line-code, a received bit stream from the first light signal, the optical data transfer link being between the master-end and a slave-end of the phase synchronized loop,
  an optoelectronic transmitter for producing, according to a transmission line-code, a second light signal carrying a bit stream to be transmitted and for directing the second light signal into the optical data transfer link,
  electrical connectors for receiving from an external device at least part of the information contained by the bit stream to be transmitted and for delivering to the external device at least part of the information contained by the received bit stream, and a processor configured to detect a first timing signal from
the received bit stream, include a second timing signal
into the bit stream to be transmitted, set values of first
bits of the bit stream to be transmitted to indicate the
reception moment of the first timing signal at the
transceiver unit, and set values of second bits of the bit
stream to be transmitted to indicate a transmission
moment of the second timing signal at the transceiver
unit, wherein the bit stream to be transmitted is in a form
corresponding to the transmission line-code, and the reception moment of the first timing signal and the transmission moment of the second timing signal are expressed with respect to a reference phase signal prevailing at the transceiver unit.

In accordance with the third aspect of the invention there is provided a new method for operating as a slave-end of a phase synchronized loop, the method comprising:

producing, according to a transmission line-code, a first light signal carrying a bit stream to be transmitted and directing the first light signal into an optical data transfer link between the slave-end and a master-end of the phase synchronized loop, receiving a second light signal from the optical data transfer link and detecting, according to a reception line-code, a received bit stream from the second light signal, including a first timing signal into the bit stream to be transmitted, detecting a second timing signal from the received bit stream, and calculating a phase difference between a phase signal prevailing at the slave-end and a reference phase signal prevailing at the master-end on the basis of (i) a transmission moment of the first timing signal at the slave-end, (ii) a first time-stamp indicating a reception moment of the first timing signal at the master-end, (iii) a reception moment of the second timing signal at the slave-end, and (iv) a second time-stamp indicating a transmission moment of the second timing signal at the master-end, wherein information indicating the values of the first and second time stamps is read from the received bit stream that is in a form corresponding to the second light signal according to the reception line-code.

In accordance with the fourth aspect of the invention there is provided a new method for operating as a master-end of a phase synchronized loop, the method comprising:

receiving a first light signal from an optical data transfer link and detecting, according to a reception line-code, a received bit stream from the first light signal, the optical data transfer link being between the master-end and a slave-end of the phase synchronized loop, producing, according to a transmission line-code, a second light signal carrying a bit stream to be transmitted and directing the second light signal into the optical data transfer link, detecting a first timing signal from the received bit stream, including a second timing signal into the bit stream to be transmitted, setting values of first bits of the bit stream to be transmitted to indicate a reception moment of the first timing signal at the master-end, and setting values of second bits of the bit stream to be transmitted to indicate a transmission moment of the second timing signal at the master-end, wherein the bit stream to be transmitted is in a form corresponding to the transmission line-code, and the reception moment of the first timing signal and the transmission moment of the second timing signal are expressed with respect to a reference phase signal prevailing at the master-end.

In accordance with the fifth aspect of the invention there is provided a new computer program for a slave-end of a phase synchronized loop, the slave-end being configured to:

produce, according to a transmission line-code, a first light signal carrying a bit stream to be transmitted and direct the first light signal into an optical data transfer link between the slave-end and a master-end of the phase synchronized loop, and receive a second light signal from the optical data transfer link and detect, according to a reception line-code, a received bit stream from the second light signal.

The computer program comprises computer executable instructions for controlling a programmable processor to:

include a first timing signal into the bit stream to be transmitted, detect a second timing signal from the received bit stream, read, from the received bit stream that is in a form corresponding to the second light signal according to the reception line-code, information indicating a value of a first time-stamp indicating a reception moment of the first timing signal at the master-end and a value of a second time stamp indicating a transmission moment of the second timing signal at the master-end, and calculate a phase difference between a phase signal prevailing at the slave end and a reference phase signal prevailing at the master-end on the basis of (i) a transmission moment of the first timing signal at the slave-end, (ii) the first time-stamp, (iii) a reception moment of the second timing signal at the slave-end, and (iv) the second time-stamp.

In accordance with the sixth aspect of the invention there is provided a new computer program for a master-end of a phase synchronized loop, the master-end being configured to:

receive a first light signal from an optical data transfer link and detect, according to a reception line-code, a received bit stream from the first light signal, the optical data transfer link being between the master-end and a slave-end of the phase synchronized loop, and produce, according to a transmission line-code, a second light signal carrying a bit stream to be transmitted and direct the second light signal into the optical data transfer link.

The computer program comprises computer executable instructions for controlling a programmable processor to:

detect a first timing signal from the received bit stream, include a second timing signal into the bit stream to be transmitted, set values of first bits of the bit stream to be transmitted to indicate a reception moment of the first timing signal at the master-end, and set values of second bits of the bit stream to be transmitted to indicate a transmission moment of the second timing signal at the master-end, wherein the bit stream to be transmitted is in a form corresponding to the transmission line-code, and the reception moment of the first timing signal and the transmission moment of the second timing signal are expressed with respect to a reference phase signal prevailing at the master-end.

A computer program product according to the invention comprises a non-volatile computer readable medium, e.g. a compact disc ("CD"), encoded with a computer program according to the fifth aspect of the invention and/or with a computer program according to the sixth aspect of the invention.

A number of exemplifying embodiments of the invention are described in accompanied dependent claims.

Various exemplifying embodiments of the invention both as to constructions and to methods of operation, together with additional objects and advantages thereof, will be best understood from the following description of specific exemplifying embodiments when read in connection with the accompanying drawings.

The verb "to comprise" is used in this document as an open limitation that neither excludes nor requires the existence of also un-recited features. The features recited in depending claims are mutually freely combinable unless otherwise explicitly stated.

BRIEF DESCRIPTION OF FIGURES

The exemplifying embodiments of the invention and their advantages are explained in greater detail below with reference to the accompanying drawings, in which.

DESCRIPTION OF EXEMPLIFYING EMBODIMENTS

Figure 1:
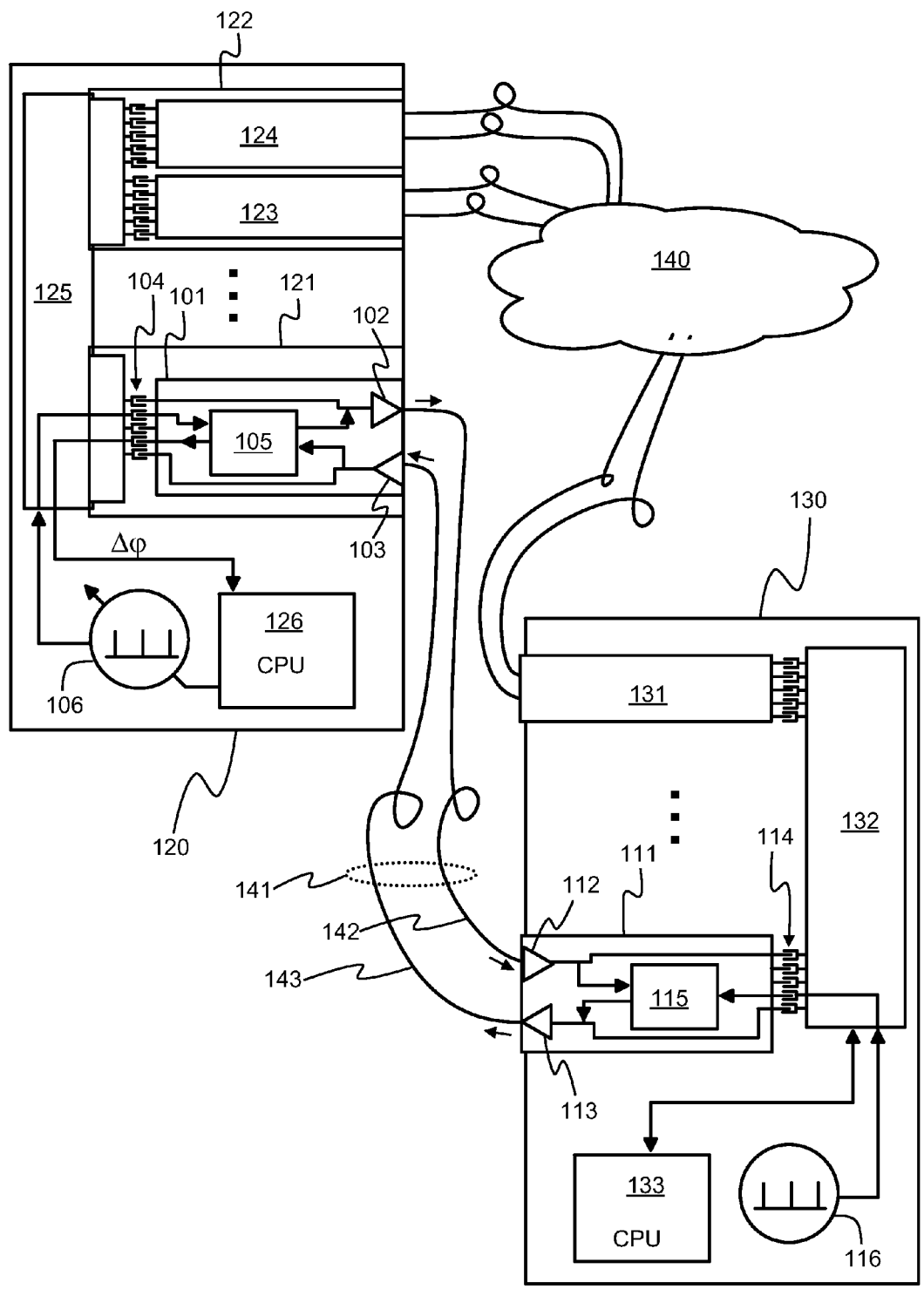
FIG. 1 shows a schematic illustration of a phase synchronized loop comprising at its master-end a transceiver unit according to an embodiment of the invention and at its slave-end a transceiver unit according to an embodiment of the invention.

FIG. 1 shows a schematic illustration of a phase synchronized loop. A network element 120 is arranged to operate as a slave-end of the phase synchronized loop and a network element 130 is arranged to operate as a master-end of the phase synchronized loop. In the exemplifying case shown in FIG. 1, the network element 120 comprises plug-in line cards such as line cards 121 and 122. Each line card of the network element 120 may comprise one or more plug-in transceiver units. The line card 122 comprises transceiver units 123 and 124, and the line card 121 comprises a transceiver unit 101. The network element 120 further comprises a cross-connect unit 125 that is arranged to connect the line cards to each other. The cross-connect unit can be, for example, a switch unit or a wiring system providing full-mesh connectivity between different line cards. The network element 120 further comprises a central processing unit 126 ("CPU") and a controllable signal generator 106 arranged to generate a phase signal. The phase signal can be, for example, a signal having one rising edge with a predetermined time interval e.g. one rising edge per second. The network element 130 comprises plug-in transceiver units such as transceiver units 111 and 131 that are interconnected via a cross-connect unit 132. The network element 130 further comprises a central processing unit 133 ("CPU") and a signal generator 116 arranged to generate a reference phase signal. The transceiver unit 101 of the network element 120 is connected with a bi-directional optical data transfer link 141 to the transceiver unit 111 of the network element 130. In the exemplifying case shown in FIG. 1, the optical data transfer link 141 comprises two optical fibres 142 and 143 in order to arrange bi-directional data transfer. However, it could be also possible to arrange the bi-directional data transfer with only one optical fibre using the time-division duplexing ("TDD") or the wavelength division duplexing. The network elements 120 and 130 and the optical data transfer link 141 constitute a part of a data transfer network. The rest of the data transfer network is presented as a cloud 140 in FIG. 1. The task of the phase synchronized loop constituted by the network elements 120 and 130 and by the optical data transfer link 141 is to make the phase of the phase signal generated by the signal generator 106 to be the same as the phase of the reference phase signal generated by the signal generator 116. For example, if the phase signal and the phase reference signal have one rinsing edge within a predetermined time interval, the task is to align the rising edges of these signals to be as simultaneous as possible.

The transceiver unit 101 is a transceiver unit according to an embodiment of the invention for the slave-end of the phase synchronized loop. The transceiver unit 101 can be for example an SFP-transceiver module (Small Form factor Pluggable) and it can be designed to support SONET (Synchronous Optical NETwork), Gigabit Ethernet, Fibre Channel, and/or other communications standards. The transceiver unit 101 comprises an optoelectronic transmitter 102 for producing, according to a transmission line-code, a first light signal carrying a bit stream to be transmitted to the network element 130 and for directing the first light signal into the optical data transfer link 141. The transmission line-code defines the manner the bit stream to be transmitted is encoded to the properties of the first light signal. The transceiver unit 101 comprises an optoelectronic receiver 103 for receiving a second light signal from the optical data transfer link 141 and for detecting, according to a reception line-code, a received bit stream from the second light signal. The reception line-code defines the manner the received bit stream is encoded to the properties of the second light signal. The transceiver unit 101 comprises a processor 105 for including a first timing signal into the bit stream to be transmitted, for detecting a second timing signal from the received bit stream, and for calculating a phase difference $\Delta\phi$ between the phase signal generated by the signal generator 106 and the reference phase signal generated by the signal generator 116. The processor 105 is configured to calculate the phase difference $\Delta\phi$ on the basis of (i) a transmission moment of the first timing signal from the network element 120, (ii) a first time-stamp indicating a reception moment of the first timing signal at the network element 130, (iii) a reception moment of the second timing signal at the network element 120, and (iv) a second time-stamp indicating a transmission moment of the second timing signal from the network element 130. The processor 105 is configured to read information indicating the values of the first and second time stamps from the received bit stream that is in a form corresponding to the received light signal according to the reception line-code. As the same processor 105 is configured to handle data that is in the form corresponding to the reception line-code and also to carry out the calculations for obtaining the phase difference Δφ, there is no need to distribute the operations for obtaining the phase difference between different units of the network element 120, e.g. the transceiver unit 101 and the CPU 126. In some cases, the bit stream to be transmitted can be in a scrambled form. Correspondingly, the received bit stream can be in a scrambled form. The processor 105 can be configured to descramble the bit stream to be transmitted prior to including the first timing signal into the bit stream to be transmitted and thereafter to scramble the bit stream to be transmitted back to the scrambled form. Correspondingly, the processor 105 can be configured to descramble the received bit stream prior to detecting the second timing signal and reading the time stamps from the received bit stream, and thereafter to scramble the received bit stream back to the scrambled form.

The processor 105 can be configured to calculate the phase difference Δy for example according to following equation:

$$\Delta\phi = ((T_2 - T_1) - (T_4 - T_3))/2, \quad (1)$$

where $T_1$ is the transmission moment of the first timing signal from the transceiver unit 101 with respect to the phase signal generated by the signal generator 106, $T_2$ is the reception moment of the first timing signal at the network element 130 with respect to the reference phase signal generated by the signal generator 116, $T_3$ is a transmission moment of the second timing signal from the network element 130 with respect to the reference phase signal, and $T_4$ is the reception moment of the second timing signal at the transceiver unit 101 with respect to the phase signal.

It should be noted that the words "first" and "second" in conjunction with the first and second time stamps and the first and second timing signals do not indicate the temporal order of these time stamps and timing signals but the words "first" and "second" are used as labels only.

The processor 105 can be a single processor unit or it can be comprise several interconnected processor units. Each processor unit can be either a programmable unit or an application specific circuit.

The transceiver unit 101 comprises electrical connectors 104. The electrical connectors comprise pins for receiving, from an external device, the phase signal and at least part of the information contained by the bit stream to be transmitted. The electrical connectors further comprise pins for delivering, to the external device, the calculated phase difference Δφ and at least part of the information contained by the received bit stream. In the exemplifying case shown in FIG. 1, the abovementioned external device is the line card 121 which is, in turn, connected to the other line cards, to the signal generator 106, and to the CPU 126 via the cross-connect unit 125. In the exemplifying case shown in FIG. 1, the CPU 126 is configured to control the phase of the phase signal on the basis of the calculated phase difference Δφ.

The transceiver unit 111 is a transceiver unit according to an embodiment of the invention for the master-end of the phase synchronized loop. The transceiver unit 111 can be for example an SFP-transceiver module (Small Form factor Pluggable) and it can be designed to support SONET (Synchronous Optical NETwork), Gigabit Ethernet, Fibre Channel, and/or other communications standards. The transceiver unit 111 comprises an optoelectronic receiver 112 for receiving the first light signal from the optical data transfer link 141 and for detecting, according to the line-code being used, the bit stream received from the network element 120. The transceiver unit 111 comprises an optoelectronic transmitter 113 for producing, according to the line-code being used, a second light signal carrying the bit stream to be transmitted to the network element 120. The transceiver unit 111 comprises a processor 115 configured to detect the first timing signal from the bit stream received from the network element 120 and include the second timing signal into the bit stream to be transmitted to the network element 120. The processor 115 is further configured to set values of first bits of the bit stream to be transmitted to represent the first time stamp that indicates the reception moment of the first timing signal at the network element 130, and to set values of second bits of the bit stream to be transmitted to represent the second time stamp that indicates the transmission moment of the second timing signal from the network element 130. The bit stream to be transmitted is in a form corresponding to the line-code being used. The reception moment of the first timing signal and the transmission moment of the second timing signal are expressed with respect to the reference phase signal generated by the signal generator 116. As the first and second time stamps are written to the bit-stream having the form corresponding to the line-code being used, the network element at the opposite end, i.e. the network element 120, is capable of reading the time stamps from the line-code form bit stream without a need for a preceding data conversion, i.e. the time stamps can be read from the output of the optoelectronic receiver 103. In some cases, the bit stream to be transmitted to the network element 120 can be in a scrambled form. Correspondingly, the bit stream received from the network element 120 can be in a scrambled form. The processor 115 can be configured to descramble the bit stream to be transmitted prior to including the second timing signal and writing the time stamps into the bit stream to be transmitted, and thereafter to scramble the bit stream to be transmitted back to the scrambled form. Correspondingly, the processor 115 can be configured to descramble the received bit stream prior to detecting the first timing signal from the received bit stream, and thereafter to scramble the received bit stream back to the scrambled form.

The transceiver unit 111 comprises electrical connectors 114. The electrical connectors comprise pins for receiving, from an external device, the reference phase signal and at least part of the information contained by the bit stream to be transmitted to the network element 120. The electrical connectors further comprise pins for delivering, to the external device, at least part of the information contained by the bit stream received from the network element 120. In the exemplifying case shown in FIG. 1, the above-mentioned external device is the cross-connect unit 132 which is, in turn, connected to the other transceiver units, to the signal generator 116, and to a central processing unit ("CPU") 133.

Figure 2:
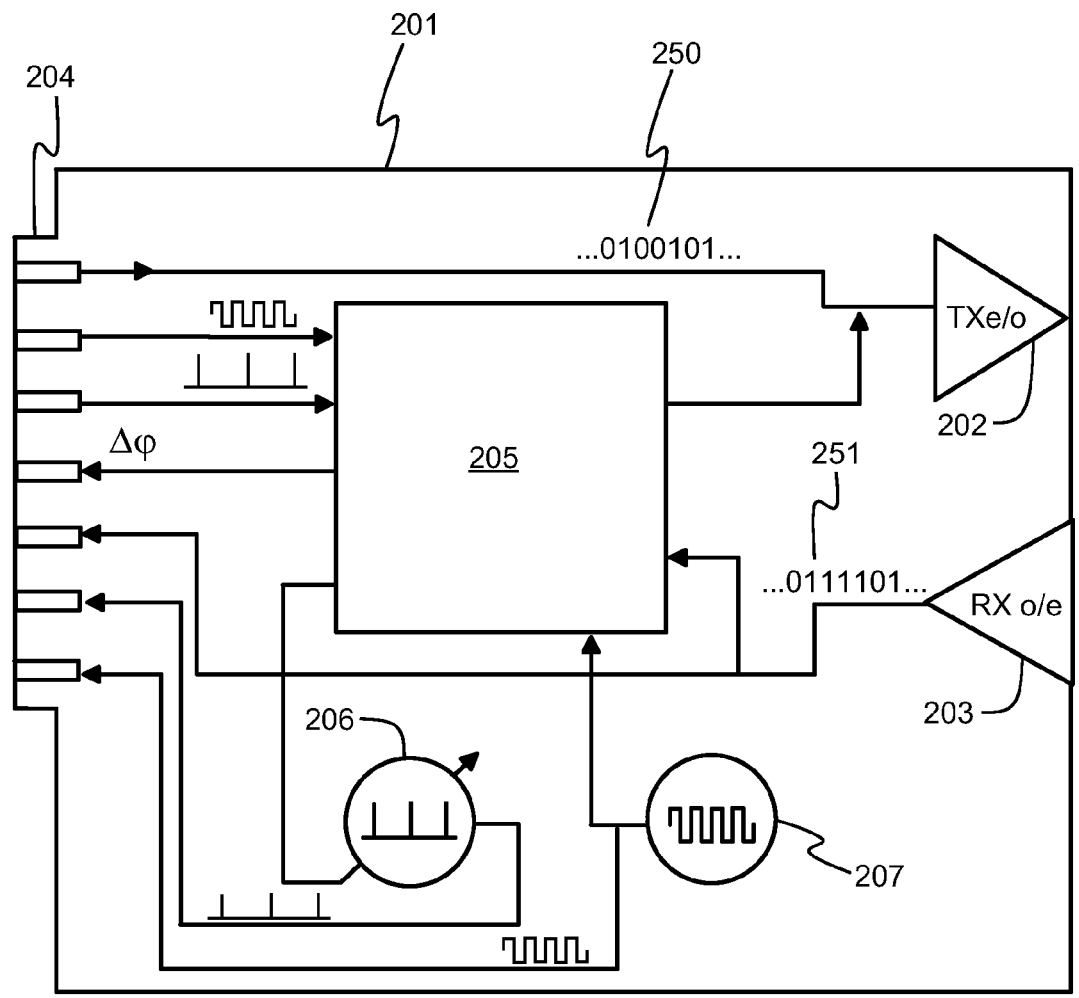
FIG. 2 shows a schematic illustration of a transceiver unit according to an embodiment of the invention for a slave-end of a phase locked loop.

FIG. 2 shows a schematic illustration of a transceiver unit 201 according to an embodiment of the invention for a slave-end of a phase locked loop. The transceiver unit is preferably a plug-in device connectable to an external device and the transceiver unit comprises:

an optoelectronic transmitter 202 ("TX e/o") for producing, according to a transmission line-code, a first light signal carrying a bit stream 250 to be transmitted and for directing the first light signal into an optical data transfer link between the slave-end and a master-end of the phase synchronized loop, an optoelectronic receiver 203 ("RX We") for receiving a second light signal from the optical data transfer link and for detecting, according to a reception line-code, a received bit stream 251 from the second light signal, electrical connectors 204 for receiving from the external device at least part of the information contained by the bit stream to be transmitted and for delivering to the external device at least part of the information contained by the received bit stream, and a processor 205 for including a first timing signal into the bit stream to be transmitted, for detecting a second timing signal from the received bit stream, and for calculating a phase difference between a phase signal prevailing at the transceiver unit and a reference phase signal prevailing at the master-end on the basis of (i) a transmission moment of the first timing signal at the transceiver unit, (ii) a first time-stamp indicating a reception moment of the first timing signal at the master-end, (iii) a reception moment of the second timing signal at the transceiver unit, and (iv) a second time-stamp indicating a transmission moment of the second timing signal at the master-end.

The processor 205 is configured to read information indicating the values of the first and second time stamps from the received bit stream 251 that is in a form corresponding to the second light signal according to the reception line-code. Thus, the processor 205 can be configured to read the information indicating the values of the first and second time stamps from the output of the optoelectronic receiver 203. In some cases, the bit stream to be transmitted can be in a scrambled form. Correspondingly, the received bit stream can be in a scrambled form. The processor 205 can be configured to descramble the bit stream to be transmitted prior to including the first timing signal into the bit stream to be transmitted and thereafter to scramble the bit stream to be transmitted back to the scrambled form. Correspondingly, the processor 205 can be configured to descramble the received bit stream prior to detecting the second timing signal and reading the time stamps from the received bit stream, and thereafter to scramble the received bit stream back to the scrambled form.

In a transceiver unit according to an embodiment of the invention, the electrical connectors 204 comprise one or more pins for receiving the phase signal from the external device.

In a transceiver unit according to an embodiment of the invention, the electrical connectors 204 comprise one or more pins for delivering a signal indicating the calculated phase difference Aγ to the external device.

A transceiver unit according to an embodiment of the invention comprises a controllable signal generator 206 configured to generate the phase signal and to change the phase of the phase signal responsive to a control signal received from the processor 205. The transceiver unit according to this embodiment of the invention can be installed in a back-to-back configuration with another transceiver unit so that this transceiver unit operates as a slave-end of a first phase synchronized loop and the other transceiver unit operates as a master-end of a second phase synchronized loop, wherein the phase signal generated by the controllable signal generator 206 is used as the reference phase signal in the second phase synchronized loop. In this kind of arrangement, the phase information is delivered via two or more cascaded phase synchronized loops.

In a transceiver unit according to an embodiment of the invention, the electrical connectors 204 comprise one or more pins for receiving a clock signal from the external device. The transceiver unit may further or alternatively comprise a clock signal generator 207 for generating the clock signal internally. The number of pulses of the clock signal after a last pulse of the phase signal represents the time prevailing at the transceiver unit.

In a transceiver unit according to an embodiment of the invention, the optoelectronic transmitter 202 is configured to use the on-off keying as the transmission line-code. In a transceiver unit according to an embodiment of the invention, the optoelectronic receiver 203 is configured to use the on-off keying as the reception line-code. In conjunction with the on-off keying, light being "ON" represents one of the two possible bit values and light being "OFF" represents the other of the two possible bit values.

In a transceiver unit according to an embodiment of the invention, the optoelectronic transmitter 202 is configured to use the wavelength keying as the transmission line-code. In a transceiver unit according to an embodiment of the invention, the optoelectronic receiver 203 is configured to use the wavelength-keying as the reception line-code. In conjunction with the wavelength keying, a shorter wavelength represents one of the two possible bit values and a longer wavelength represents the other of the two possible bit values.

In a transceiver unit according to an embodiment of the invention, the optoelectronic transmitter 202 and the optoelectronic receiver 203 are configured to use a same line-code as the transmission line-code and as the reception line-code.

Figure 3:
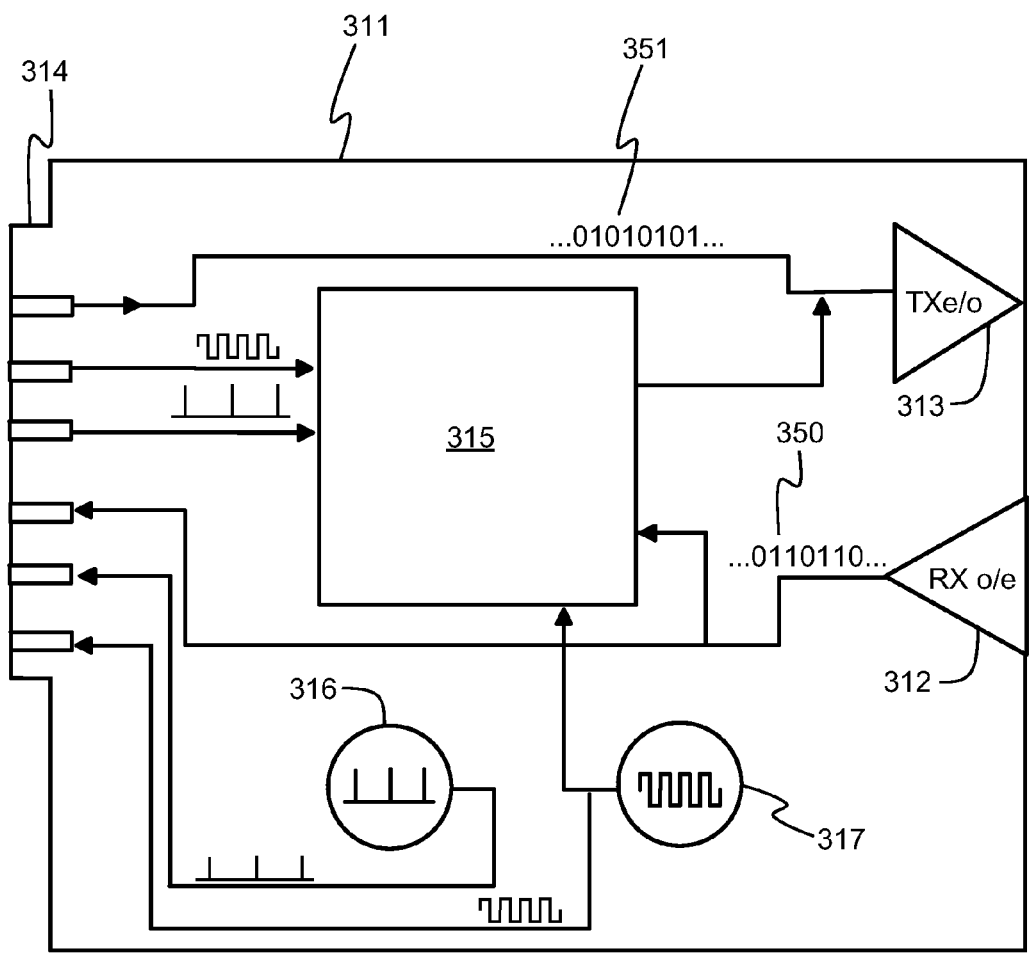
FIG. 3 shows a schematic illustration of a transceiver unit according to an embodiment of the invention for a master-end of a phase locked loop.

FIG. 3 shows a schematic illustration of a transceiver unit 311 according to an embodiment of the invention for a master-end of a phase locked loop. The transceiver unit is preferably a plug-in device connectable to an external device and the transceiver unit comprises:

an optoelectronic receiver 312 ("RX o/e") for receiving a first light signal from an optical data transfer link and for detecting, according to a reception line-code, a received bit stream 350 from the first light signal, the optical data transfer link being between the master-end and a slave-end of the phase synchronized loop, an optoelectronic transmitter 313 ("TX e/o") for producing, according to a transmission line-code, a second light signal carrying a bit stream 351 to be transmitted and for directing the second light signal into the optical data transfer link, electrical connectors 314 for receiving from the external device at least part of the information contained by the bit stream to be transmitted and for delivering to the external device at least part of the information contained by the received bit stream, and processor 315 configured to detect a first timing signal from the received bit stream, include a second timing signal into the bit stream to be transmitted, set values of first bits of the bit stream to be transmitted to indicate a reception moment of the first timing signal at the transceiver unit, and set values of second bits of the bit stream to be transmitted to indicate a transmission moment of the second timing signal at the transceiver unit.

The bit stream to be transmitted is in a form corresponding to the transmission line-code, and the reception moment of the first timing signal and the transmission moment of the second timing signal are expressed with respect to a reference phase signal prevailing at the transceiver unit.

In some cases, the bit stream to be transmitted can be in a scrambled form. Correspondingly, the received bit stream can be in a scrambled form. The processor 315 can be configured to descramble the bit stream to be transmitted prior to including the second timing signal and setting the values of the first and second bits, and thereafter to scramble the bit stream to be transmitted back to the scrambled form. Correspondingly, the processor 315 can be configured to descramble the received bit stream prior to detecting the first timing signal from the received bit stream, and thereafter to scramble the received bit stream back to the scrambled form.

In a transceiver unit according to an embodiment of the invention, the electrical connectors 314 comprise one or more pins for receiving the reference phase signal from the external device. The transceiver unit according to this embodiment of the invention can be installed in a back-to-back configuration with another transceiver unit so that this transceiver unit operates as a master-end of a first phase synchronized loop and the other transceiver unit operates as a slave-end of a second phase synchronized loop, wherein the second phase synchronized loop delivers the reference phase signal to the first phase synchronized loop.

A transceiver unit according to an embodiment of the invention comprises a signal generator 316 configured to generate the reference phase signal.

In a transceiver unit according to an embodiment of the invention, the electrical connectors 314 comprise one or more pins for receiving a clock signal from the external device. The transceiver unit may further or alternatively comprise a clock signal generator 317 for generating the clock signal internally. The number of pulses of the clock signal after a last pulse of the reference phase signal represents the time prevailing at the transceiver unit.

In a transceiver unit according to an embodiment of the invention, the optoelectronic transmitter 313 is configured to use the on-off keying as the transmission line-code. In a transceiver unit according to an embodiment of the invention, the optoelectronic receiver 312 is configured to use the on-off keying as the reception line-code.

In a transceiver unit according to an embodiment of the invention, the optoelectronic transmitter 313 is configured to use the wavelength keying as the transmission line-code. In a transceiver unit according to an embodiment of the invention, the optoelectronic receiver 312 is configured to use the wavelength-keying as the reception line-code.

In a transceiver unit according to an embodiment of the invention, the optoelectronic transmitter 313 and the optoelectronic receiver 312 are configured to use a same line-code as the transmission line-code and as the reception line-code.

Figure 4:
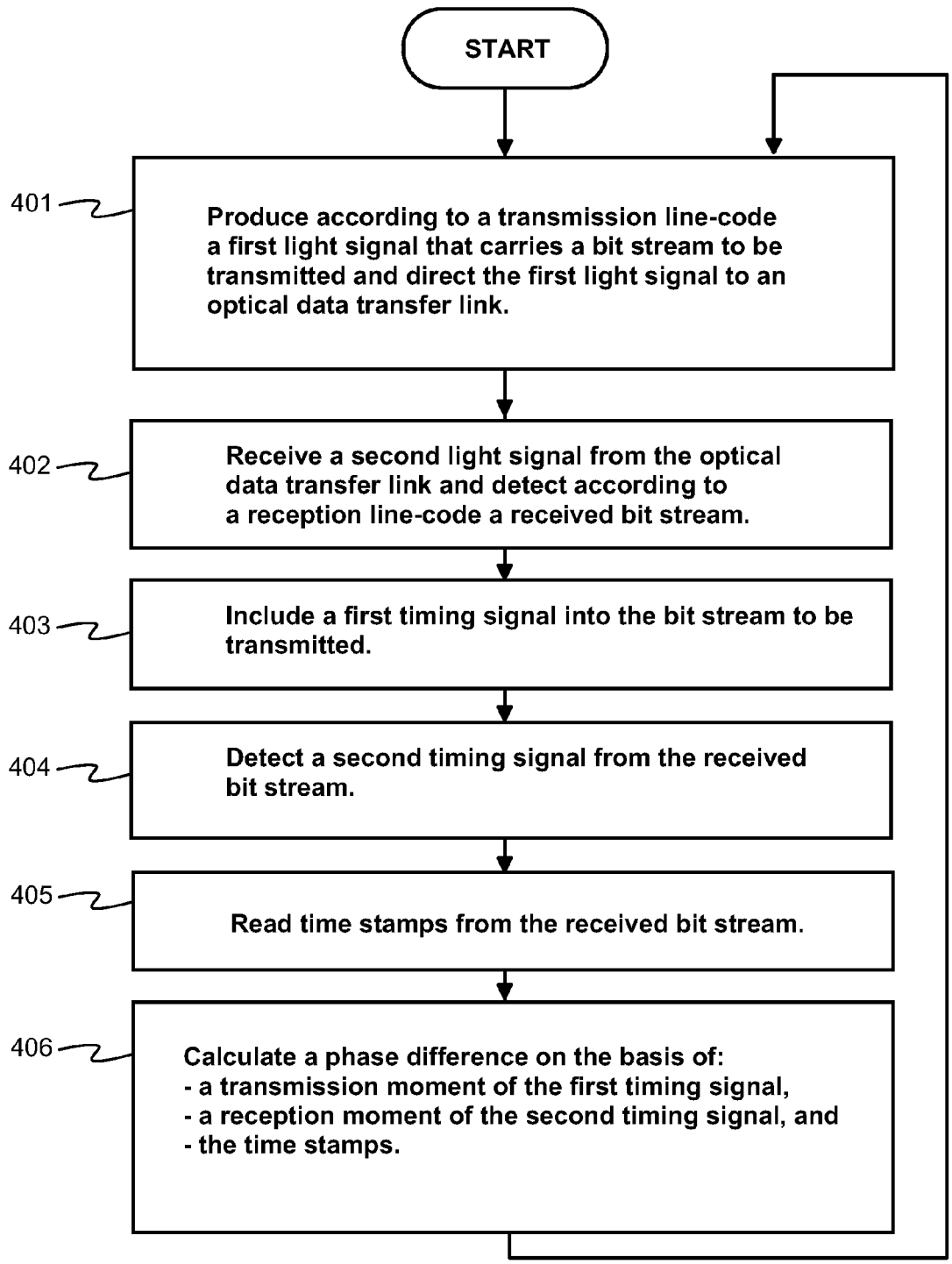
FIG. 4 shows a flow chart of a method according to an embodiment of the invention for operating as a slave-end of a phase synchronized loop.

FIG. 4 shows a flow chart of a method according to an embodiment of the invention for operating as a slave-end of a phase synchronized loop. The method comprises the following actions:

action 401: producing, according to a transmission line-code, a first light signal carrying a bit stream to be transmitted and directing the first light signal into an optical data transfer link between the slave-end and a master-end of the phase synchronized loop, action 402: receiving a second light signal from the optical data transfer link and detecting, according to a reception line-code, a received bit stream from the second light signal, action 403: including a first timing signal into the bit stream to be transmitted, action 404: detecting a second timing signal from the received bit stream, action 405: reading information indicating the values of first and second time stamps from the received bit stream that is in a form corresponding to the second light signal according to the reception line-code, the first time-stamp indicating a reception moment of the first timing signal at the master-end and the second time-stamp indicating a transmission moment of the second timing signal at the master-end, and action 406: calculating a phase difference between a phase signal prevailing at the slave-end and a reference phase signal prevailing at the master-end on the basis of (i) a transmission moment of the first timing signal at the slave-end, (ii) the first time-stamp, (iii) a reception moment of the second timing signal at the slave-end, and (iv) the second time-stamp.

In some cases, the bit stream to be transmitted can be in a scrambled form. Correspondingly, the received bit stream can be in a scrambled form. In these cases, the bit stream to be transmitted can be descrambled prior to including the first timing signal into the bit stream to be transmitted and thereafter the bit stream to be transmitted can be scrambled to back the scrambled form. Correspondingly, the received bit stream can be descrambled prior to detecting the second timing signal and reading the time stamps from the received bit stream, and thereafter the received bit stream can be scrambled back to the scrambled form.

Figure 5:
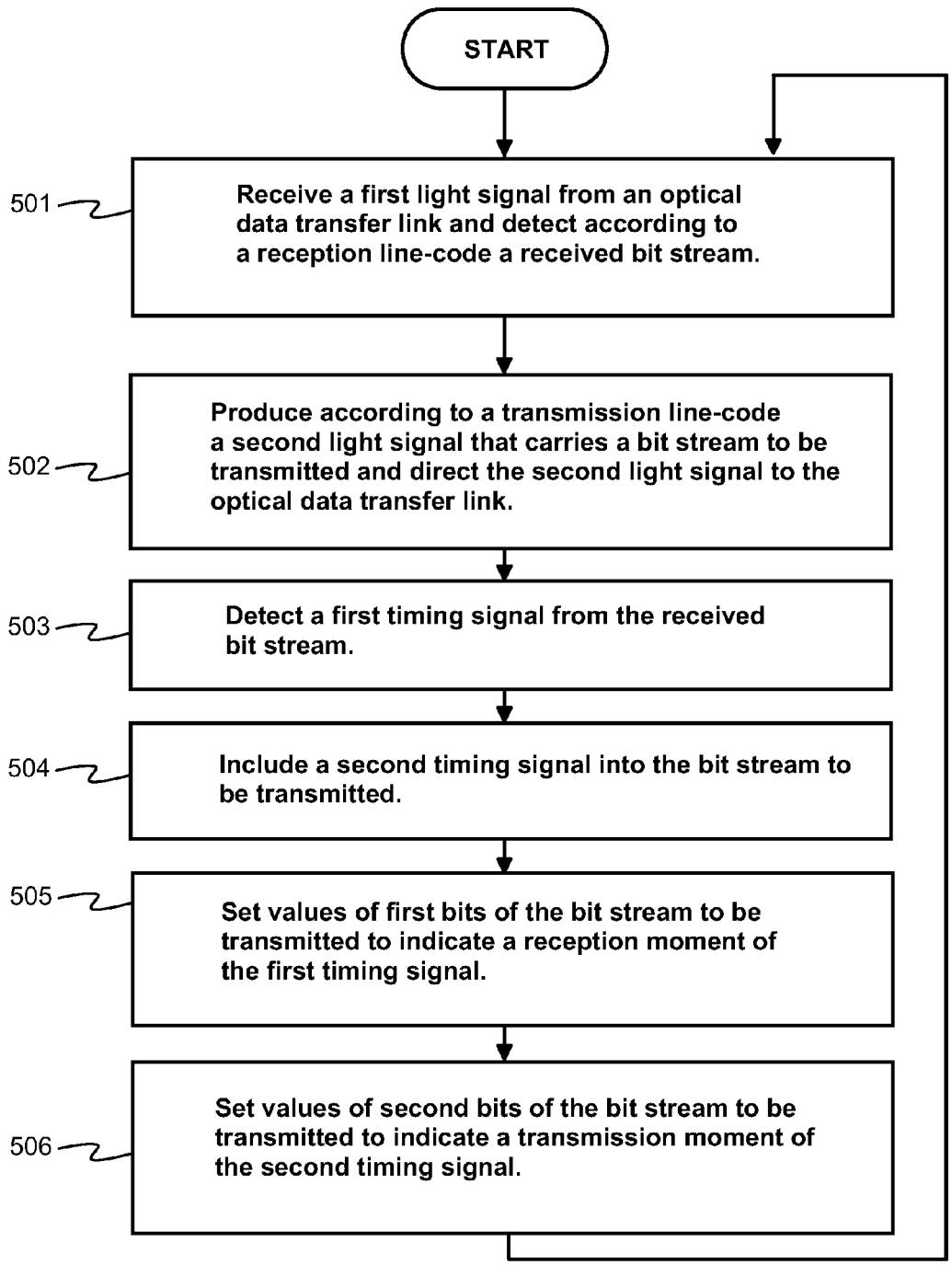
FIG. 5 shows a flow chart of a method according to an embodiment of the invention for operating as a master-end of a phase synchronized loop.

FIG. 5 shows a flow chart of a method according to an embodiment of the invention for operating as a master-end of a phase synchronized loop. The method comprises the following actions:

action 501: receiving a first light signal from an optical data transfer link and detecting, according to a reception line-code, a received bit stream from the first light signal, the optical data transfer link being between the master-end and a slave-end of the phase synchronized loop, action 502: producing, according to a transmission line-code, a second light signal carrying a bit stream to be transmitted and directing the second light signal into the optical data transfer link, action 503: detecting a first timing signal from the received bit stream, action 504: including a second timing signal into the bit stream to be transmitted, action 505: setting values of first bits of the bit stream to be transmitted to indicate a reception moment of the first timing signal at the master-end, and action 506: setting values of second bits of the bit stream to be transmitted to indicate a transmission moment of the second timing signal at the master-end.

The bit stream to be transmitted is in a form corresponding to the transmission line-code, and the reception moment of the first timing signal and the transmission moment of the second timing signal are expressed with respect to a reference phase signal prevailing at the master-end.

In some cases, the bit stream to be transmitted can be in a scrambled form. Correspondingly, the received bit stream can be in a scrambled form. In these cases, the bit stream to be transmitted can be descrambled prior to including the second timing signal and setting the values of the first and second bits, and thereafter the bit stream to be transmitted can be scrambled back to the scrambled form. Correspondingly, the received bit stream can be scrambled prior to detecting the first timing signal from the received bit stream, and thereafter the received bit stream can be scrambled back to the scrambled form.

A computer program according to an embodiment of the invention comprises software modules for a slave-end of a phase synchronized loop, where the slave-end is configured to:

produce, according to a transmission line-code, a first light signal carrying a bit stream to be transmitted and direct the first light signal into an optical data transfer link between the slave-end and a master-end of the phase synchronized loop, and receive a second light signal from the optical data transfer link and detect, according to a reception line-code, a received bit stream from the second light signal.

The software modules for the slave-end comprise computer executable instructions for controlling a programmable processor to:

include a first timing signal into the bit stream to be transmitted, detect a second timing signal from the received bit stream, read, from the received bit stream that is in a form corresponding to the second light signal according to the reception line-code, information indicating a value of a first time-stamp indicating a reception moment of the first timing signal at the master-end and a value of a second time stamp indicating a transmission moment of the second timing signal at the master-end, and calculate a phase difference between a phase signal prevailing at the slave end and a reference phase signal prevailing at the master-end on the basis of (i) a transmission moment of the first timing signal at the slave-end, (ii) the first time-stamp, (iii) a reception moment of the second timing signal at the slave-end, and (iv) the second time-stamp.

The software modules for the slave-end can be, for example, subroutines and functions generated with a suitable programming language.

A computer program according to an embodiment of the invention comprises software modules for a master-end of a phase synchronized loop, where the master-end is configured to:

receive a first light signal from an optical data transfer link and detect, according to a reception line-code, a received bit stream from the first light signal, the optical data transfer link being between the master-end and a slave-end of the phase synchronized loop, and produce, according to a transmission line-code, a second light signal carrying a bit stream to be transmitted and direct the second light signal into the optical data transfer link.

The software modules for the master-end comprise computer executable instructions for controlling a programmable processor to:

detect a first timing signal from the received bit stream, include a second timing signal into the bit stream to be transmitted, set values of first bits of the bit stream to be transmitted to indicate a reception moment of the first timing signal at the master-end, and set values of second bits of the bit stream to be transmitted to indicate a transmission moment of the second timing signal at the master-end, wherein the bit stream to be transmitted is in a form corresponding to the transmission line-code, and the reception moment of the first timing signal and the transmission moment of the second timing signal are expressed with respect to a reference phase signal prevailing at the master-end.

The software modules for the master-end can be, for example, subroutines and functions generated with a suitable programming language.

A computer program product according to an embodiment of the invention comprises a computer readable medium, e.g. a compact disc ("CD"), encoded with the software modules for the slave-end and/or with the software modules for the master-end.

A signal according to an embodiment of the invention is encoded to carry information defining the software modules for the slave-end and/or the software modules for the master-end.

The specific examples provided in the description given above should not be construed as limiting. Therefore, the invention is not limited merely to the embodiments described above, many variants being possible.

What is claimed is:

1. A transceiver unit for a slave-end of a phase synchronized loop, the transceiver unit comprising:

an optoelectronic transmitter for producing, according to a transmission line-code, a first light signal carrying a bit stream to be transmitted and for directing the first light signal into an optical data transfer link between the slave-end and a master-end of the phase synchronized loop, an optoelectronic receiver for receiving a second light signal from the optical data transfer link and for detecting, according to a reception line-code, a received bit stream from the second light signal, electrical connectors for receiving from an external device at least part of the information contained by the bit stream to be transmitted and for delivering to the external device at least part of the information contained by the received bit stream, and a processor for including a first timing signal into the bit stream to be transmitted, for detecting a second timing signal from the received bit stream, and for calculating a phase difference between a phase signal prevailing at the transceiver unit and a reference phase signal prevailing at the master-end on the basis of (i) a transmission moment of the first timing signal at the transceiver unit, (ii) a first time-stamp indicating a reception moment of the first timing signal at the master-end, (iii) a reception moment of the second timing signal at the transceiver unit, and (iv) a second time-stamp indicating a transmission moment of the second timing signal at the master-end, wherein the transmission line-code defines the manner the bit stream to be transmitted is encoded to the properties of the first light signal and the reception line-code defines the manner the received bit stream is encoded to the properties of the second light signal, and the processor is configured to read information indicating the values of the first and second time stamps from the received bit stream that is in a form corresponding to the second light signal according to the reception line-code.

2. A transceiver unit according to claim 1, wherein the transceiver unit is configured to receive the phase signal from the external device.

3. A transceiver unit according to claim 2, wherein the transceiver unit is configured to deliver a signal indicating the calculated phase difference to the external device.

4. A transceiver unit according to claim 1, wherein the transceiver unit comprises a controllable signal generator configured to generate the phase signal and to change the phase of the phase signal on the basis of the calculated phase difference.

5. A transceiver unit according to claim 1, wherein the transceiver unit is configured to receive a clock signal from the external device, a number of pulses of the clock signal after a last pulse of the phase signal representing time prevailing at the transceiver unit.

6. A transceiver unit according to claim 1, wherein the transceiver unit comprises a clock signal generator for generating a clock signal, a number of pulses of the clock signal after a last pulse of the phase signal representing time prevailing at the transceiver unit.

7. A transceiver unit according to claim 1, wherein the optoelectronic transmitter is configured to use on-off keying as the transmission line-code and/or the opto-electronic receiver is configured to use the on-off keying as the reception line-code, where light being on represents one of the two possible bit values and light being off represents the other of the two possible bit values.

8. A transceiver unit according to claim 1, wherein the optoelectronic transmitter is configured to use wavelength keying as the transmission line-code and/or the optoelectronic receiver is configured to use the wavelength-keying as the reception line-code, where a shorter wavelength represents one of the two possible bit values and a longer wavelength represents the other of the two possible bit values.

9. A transceiver unit according to claim 1, wherein the optoelectronic transmitter and the optoelectronic receiver are configured to use a same line-code as the transmission line-code and as the reception line-code.

10. A transceiver unit according to claim 1, wherein the processor is configured to calculate the phase difference $\Delta\Phi$ according to equation:

$$\Delta\Phi = ((T2-T1)-(T4-T3))/2,$$

where T1 is the transmission moment of the first timing signal from the transceiver unit with respect to the phase signal prevailing at the transceiver unit, T2 is the reception moment of the first timing signal at the master-end with respect to the reference phase signal prevailing at the master-end, T3 is a transmission moment of the second timing signal from the master-end with respect to the reference phase signal prevailing at the master-end, and T4 is the reception moment of the second timing signal at the transceiver unit with respect to the phase signal prevailing at the transceiver unit.

11. A transceiver unit according to claim 1, wherein the transceiver unit is a plug-in device connectable to the external device.

12. A transceiver unit for a master-end of a phase synchronized loop, the transceiver unit comprising:
an optoelectronic receiver for receiving a first light signal from an optical data transfer link and for detecting, according to a reception line-code, a received bit stream from the first light signal, the optical data transfer link being between the master-end and a slave-end of the phase synchronized loop,
an optoelectronic transmitter for producing, according to a transmission line-code, a second light signal carrying a bit stream to be transmitted and for directing the second light signal into the optical data transfer link,
electrical connectors for receiving from an external device at least part of the information contained by the bit stream to be transmitted and for delivering to the external device at least part of the information contained by the received bit stream, and
a processor configured to detect a first timing signal from the received bit stream and include a second timing signal into the bit stream to be transmitted,
wherein the reception line-code defines the manner the received bit stream is encoded to the properties of the first light signal and the transmission line-code defines the manner the bit stream to be transmitted is encoded to the properties of the second light signal, and the processor is configured to set values of first bits of the bit stream to be transmitted to indicate a reception moment of the first timing signal at the transceiver unit, and set values of second bits of the bit stream to be transmitted to indicate a transmission moment of the second timing signal at the transceiver unit, the bit stream to be transmitted being in a form corresponding to the transmission line-code and the reception moment of the first timing signal and the transmission moment of the second timing signal being expressed with respect to a reference phase signal prevailing at the transceiver unit.

13. A transceiver unit according to claim 12, wherein the transceiver unit is configured to receive the reference phase signal from the external device.

14. A transceiver unit according to claim 12, wherein the transceiver unit comprises a signal generator configured to generate the reference phase signal.

15. A transceiver unit according to claim 12, wherein the transceiver unit is configured to receive a clock signal from the external device, a number of pulses of the clock signal after a last pulse of the reference phase signal representing time prevailing at the transceiver unit.

16. A transceiver unit according to claim 12, wherein the transceiver unit comprises a clock signal generator for generating a clock signal, a number of pulses of the clock signal after a last pulse of the reference phase signal representing time prevailing at the transceiver unit.

17. A transceiver unit according to claim 12, wherein the optoelectronic transmitter is configured to use on-off keying as the transmission line-code and/or the optoelectronic receiver is configured to use the on-off keying as the reception line-code, where light being on represents one of the two possible bit values and light being off represents the other of the two possible bit values.

18. A transceiver unit according to claim 12, wherein the optoelectronic transmitter is configured to use wavelength keying as the transmission line-code and/or the optoelectronic receiver is configured to use the wavelength-keying as the reception line-code, where a shorter wavelength represents one of the two possible bit values and a longer wavelength represents the other of the two possible bit values.

19. A transceiver unit according to claim 12, wherein the optoelectronic transmitter and the optoelectronic receiver are configured to use a same line-code as the transmission line-code and as the reception line-code.

20. A transceiver unit according to claim 12, wherein the transceiver unit is a plug-in device connectable to the external device.

21. A method for operating as a slave-end of a phase synchronized loop, the method comprising:
producing, according to a transmission line-code, a first light signal carrying a bit stream to be transmitted and directing the first light signal into an optical data transfer link between the slave-end and a master-end of the phase synchronized loop,
receiving a second light signal from the optical data transfer link and detecting, according to a reception line-code, a received bit stream from the second light signal, and
including a first timing signal into the bit stream to be transmitted,
detecting a second timing signal from the received bit stream, and
calculating a phase difference between a phase signal prevailing at the slave-end and a reference phase signal prevailing at the master-end on the basis of (i) a transmission moment of the first timing signal at the slave-end, (ii) a first time-stamp indicating a reception moment of the first timing signal at the master-end, (iii) a reception moment of the second timing signal at the slave-end, and (iv) a second time-stamp indicating a transmission moment of the second timing signal at the master-end, wherein the transmission line-code defines the manner the bit stream to be transmitted is encoded to the properties of the first light signal and the reception line-code defines the manner the received bit stream is encoded to the properties of the second light signal, and wherein the method comprises reading information indicating the values of the first and second time stamps from the received bit stream that is in a form corresponding to the second light signal according to the reception line-code.

22. A method for operating as a master-end of a phase synchronized loop, the method comprising:

receiving a first light signal from an optical data transfer link and detecting, according to a reception line-code, a received bit stream from the first light signal, the optical data transfer link being between the master-end and a slave-end of the phase synchronized loop, and producing, according to a transmission line-code, a second light signal carrying a bit stream to be transmitted and directing the second light signal into the optical data transfer link, detecting a first timing signal from the received bit stream, including a second timing signal into the bit stream to be transmitted, wherein the reception line-code defines the manner the received bit stream is encoded to the properties of the first light signal and the transmission line-code defines the manner the bit stream to be transmitted is encoded to the properties of the second light signal, and the method further comprises:

setting values of first bits of the bit stream to be transmitted to indicate a reception moment of the first timing signal at the master-end, and setting values of second bits of the bit stream to be transmitted to indicate a transmission moment of the second timing signal at the master-end, the bit stream to be transmitted being in a form corresponding to the transmission line-code and the reception moment of the first timing signal and the transmission moment of the second timing signal being expressed with respect to a reference phase signal prevailing at the master-end.

23. A non-transitory computer readable medium encoded with a computer program for a slave-end of a phase synchronized loop, the slave-end being configured to:

produce, according to a transmission line-code, a first light signal carrying a bit stream to be transmitted and direct the first light signal into an optical data transfer link between the slave-end and a master-end of the phase synchronized loop, the transmission line-code defining the manner the bit stream to be transmitted is encoded to the properties of the first light signal, and receive a second light signal from the optical data transfer link and detect, according to a reception line-code, a received bit stream from the second light signal, the reception line-code defining the manner the received bit stream is encoded to the properties of the second light signal, the computer program comprising computer executable instructions for controlling a programmable processor to:

include a first timing signal into the bit stream to be transmitted, detect a second timing signal from the received bit stream, calculate a phase difference between a phase signal prevailing at the slave end and a reference phase signal prevailing at the master-end on the basis of (i) a transmission moment of the first timing signal at the slave-end, (ii) a first time-stamp indicating a reception moment of the first timing signal at the master-end, (iii) a reception moment of the second timing signal at the slave-end, and (iv) a second time-stamp indicating a transmission moment of the second timing signal at the master-end, and read information indicating the values of the first and second time stamps from the received bit stream that is in a form corresponding to the second light signal according to the reception line-code.

24. A non-transitory computer readable medium encoded with a computer program for a master-end of a phase synchronized loop, the master-end being configured to:

receive a first light signal from an optical data transfer link and detect, according to a reception line-code, a received bit stream from the first light signal, the optical data transfer link being between the master-end and a slave-end of the phase synchronized loop, the reception line-code defining the manner the received bit stream is encoded to the properties of the first light signal, and produce, according to a transmission line-code, a second light signal carrying a bit stream to be transmitted and direct the second light signal into the optical data transfer link, the transmission line-code defining the manner the bit stream to be transmitted is encoded to the properties of the second light signal, the computer program comprising computer executable instructions for controlling a programmable processor to:

detect a first timing signal from the received bit stream, include a second timing signal into the bit stream to be transmitted, set values of first bits of the bit stream to be transmitted to indicate a reception moment of the first timing signal at the master-end, and set values of second bits of the bit stream to be transmitted to indicate a transmission moment of the second timing signal at the master-end, the bit stream to be transmitted being in a form corresponding to the transmission line-code and the reception moment of the first timing signal and the transmission moment of the second timing signal being expressed with respect to a reference phase signal prevailing at the master-end.

* * * * *